(12) United States Patent
Aoki (10) Patent No.: US 6,183,351 B1
(45) Date of Patent: Feb. 6, 2001

(54) METHOD OF SUPPLYING A CHEMICAL MECHANICAL POLISHING LIQUID AND APPARATUS THEREFOR

(75) Inventor: Hidemitsu Aoki, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/292,685

(22) Filed: Apr. 15, 1999

(30) Foreign Application Priority Data

Apr. 15, 1998 (JP) .................................................. 10-105104

(51) Int. Cl.⁷ ...................................................... B24B 57/04

(52) U.S. Cl. ...................................... 451/60; 451/6; 451/7; 451/53; 451/446; 210/739; 385/128; 438/693

(58) Field of Search ............................... 451/6, 2, 53, 60, 451/446; 210/759; 385/128; 438/693

(56) References Cited

U.S. PATENT DOCUMENTS

| 5,703,988 | * | 12/1997 | Oishi et al. ........................... 385/128 |
| 5,787,047 | * | 8/1998 | Tekawa ................................. 210/739 |
| 5,922,620 | * | 7/1999 | Shimomura et al. .................. 451/60 |
| 6,012,967 | * | 1/2000 | Satake et al. ............................ 451/6 |
| 6,040,245 | * | 3/2000 | Sandhu et al. ....................... 438/692 |

\* cited by examiner

*Primary Examiner*—David A. Scherbel
*Assistant Examiner*—George Nguyen
(74) *Attorney, Agent, or Firm*—Scully, Scott, Murphy & Presser (57) ABSTRACT

The first present invention provides an apparatus for activating a polishing liquid including polishing particles and hydrogen peroxide for carrying out a chemical mechanical polishing method to a surface of a wafer to be polished, wherein the apparatus comprises an ultraviolet ray irradiation system for an irradiation of an ultraviolet ray to the polishing liquid.

16 Claims, 6 Drawing Sheets

METHOD OF SUPPLYING A CHEMICAL MECHANICAL POLISHING LIQUID AND APPARATUS THEREFOR

BACKGROUND OF THE INVENTION

The present invention relates to a method of supplying a chemical mechanical polishing liquid and an apparatus therefor.

Logic devices in the semiconductor devices are required to exhibit excellent high speed performances. In order to form multilevel interconnection structure, a process is necessary for carrying out a chemical mechanical polishing to a metal layer such as a tungsten layer, wherein an oxidizing agent is used for oxidizing the metal layer as a chemical polishing and subsequently removing the oxidized metal layer with polishing particles as a mechanical polishing. In order to rise the rate of the chemical and mechanical polishing, it is necessary to use an oxidizing agent as a solvent which has a large oxidizing capability.

The chemical mechanical polishing to the tungsten layer may be carried out by polishing agents. One of the available polishing agents which may, for example, comprise a mixing solution of hydrogen peroxide and iron nitrate as an oxidizing agent added with silica particles. Other available polishing agent comprises a polishing solution including KI03 as an oxidizing agent and alumina particles. Further another available polishing agent is an iron nitrate polishing solution showing a high polishing rate.

Figure 1:
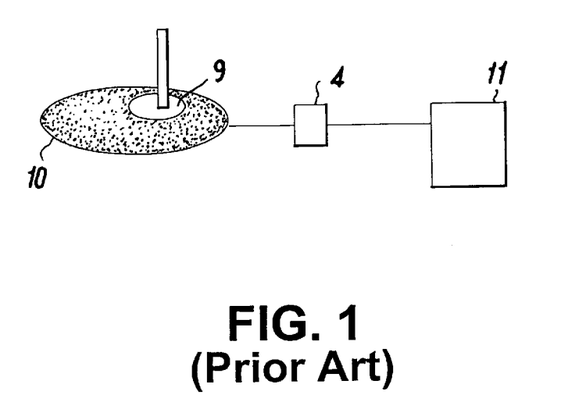
FIG. 1 is a schematic view illustrative of a conventional chemical mechanical polishing system, wherein an iron nitrate is used as a polishing liquid.

FIG. 1 is a schematic view illustrative of a conventional chemical mechanical polishing system, wherein an iron nitrate is used as a polishing liquid Iron Fe acts as a catalyst in the hydrogen peroxide solution for Fenton's oxidation to efficiently generate OH-radicals. Oxidizing power of the OH-radicals oxidizes tungsten to form $WO_4^{2-}$ ions which promotes chemical etching to tungsten, resulting in an increase in rate of the chemical mechanical polishing.

Heavy metal such as Fe is added in small amount into the solvent for increasing the oxidizing power. However, such heavy metal is likely to reside on the polishing surface of the device. This residual heavy metal contaminates the device thereby deterioration in performances and characteristics of the contaminated device, whereby the reliability of the semiconductor device is lowered. In addition the residual heavy metal on the device also results in a further contamination of the as a cross contamination of the production line or manufacturing line. The cross contamination is extremely serious problem when the logic device is manufactured in the common production lime to DRAM which requires an extremely high cleaning level.

In the above circumstances, it had been required to develop a novel method of chemical mechanical polishing to a metal layer in surface of a semiconductor device free from the above problems.

SUMMARY OF THE INVENTION

Accordingly; it is an object of the present invention to provide a novel method of chemical mechanical polishing to a metal layer in a surface of a semiconductor device free from the above problems.

It is a further object of the present invention to provide a novel method of chemical mechanical polishing to a metal layer in a surface of a semiconductor device free from a problem with a heavy metal contamination to the polished surface of the semiconductor device.

It is a still further object of the present invention to provide a novel chemical mechanical polishing to a metal layer in a surface of a semiconductor device using a polishing liquid which is free of added heavy metal and possessing a high cleaning power.

It is yet a further object of the present invention to provide a novel method of supplying a polishing liquid for carrying out a chemical mechanical polishing to a metal layer in a surface of a semiconductor device, which is free from the above problems.

It is a further more object of the present invention to provide a novel method of supplying a polishing liquid for carrying out a chemical mechanical polishing to a metal layer in a surface of a semiconductor device, which is free from a problem with a heavy metal contamination to the polished surface of the semiconductor device.

It is still more object of the present invention to provide a novel method of supplying a polishing liquid for carrying out a chemical mechanical polishing to a metal layer in a surface of a semiconductor device, wherein the polishing liquid is free of added heavy metal and possesses a high cleaning power.

It is moreover object of the present invention to provide a novel apparatus for chemical mechanical polishing to a metal layer in a surface of a semiconductor device free from the above problems.

It is another object of the present invention to provide a novel apparatus for chemical mechanical polishing to a metal layer in a surface of a semiconductor device free from a problem with a heavy metal contamination to the polished surface of the semiconductor device.

It is still another object of the present invention to provide a novel apparatus for chemical mechanical polishing to a metal layer in a surface of a semiconductor device using a polishing liquid which is free of added heavy metal and possessing a high cleaning power.

The present invention provides an apparatus for activating a polishing liquid including polishing particles and hydrogen peroxide for carrying out a chemical mechanical polishing method to a surface of a wafer to be polished, wherein the apparatus comprises an ultraviolet ray irradiation system for an irradiation of an ultraviolet ray to the polishing liquid. The polishing liquid is free of any heavy metal which provides contamination to the polished surface of the wafer. The hydrogen peroxide in the polishing liquid is activated by the ultraviolet ray irradiation to form or generate OH-radicals which possesses such a high oxidizing power as the conventional iron nitrate containing polishing liquid.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides an apparatus for activating a polishing liquid including polishing particles and hydrogen peroxide for carrying out a chemical mechanical polishing method to a surface of a wafer to be polished, wherein the apparatus comprises an ultraviolet ray irradiation system for an irradiation of an ultraviolet ray to the polishing liquid. The polishing liquid is free of any heavy metal which provides contamination to the polished surface of the wafer. The hydrogen peroxide in the polishing liquid is activated by the ultraviolet ray irradiation to form or generate OH-radicals which possesses such a high oxidizing power as the conventional iron nitrate containing polishing liquid.

It is also preferable that the ultraviolet ray irradiation system comprises: a tube transparent to an ultraviolet ray for allowing the polishing liquid to be flowed through the tube and for preventing the polishing liquid from an atmosphere; and an ultraviolet ray irradiator provided outside of the tube for irradiating an ultraviolet ray through the tube onto the polishing liquid.

It is also preferable that the ultraviolet ray irradiator is capable of emitting the ultraviolet ray in the range of 150–320 nanometers.

It is also preferable that the ultraviolet ray irradiator comprises one of a high pressure mercury lamp, a low pressure mercury lamp and a xenon lamp.

It is also preferable that the tube has a flow rate adjuster for adjusting a flow rate of the polishing liquid for controlling a time of irradiation of the ultraviolet ray onto the polishing liquid.

It is also preferable that the tube comprises a quartz glass tube.

It is also preferable that the tube has a length of not longer than 5 meters for preventing any reservation of the polishing liquid.

It is also preferable that the tube has a length of not longer than 1 meter for preventing any reservation of the polishing liquid.

It is also preferable to further comprise an ultraviolet ray mirror provided in an opposite side to the ultraviolet ray irradiator with reference to the tube so that the tube extends between the ultraviolet ray irradiator and the ultraviolet ray mirror.

It is also preferable that the ultraviolet ray irradiator and the ultraviolet ray mirror two-dimensionally extend to form an inter-space defined between the ultraviolet ray irradiator and the ultraviolet ray mirror, whilst the tube extends with curving throughout entirely the inter-space.

The above novel apparatus of the first present invention is applicable to a chemical mechanical polishing system which comprises: a reservoir for reserving a polishing liquid including polishing particles and hydrogen peroxide; a polishing pad for carrying out a chemical mechanical polishing to a wafer; a polishing liquid feeding system connected to the reservoir for feeding the polishing liquid onto the polishing pad, wherein the polishing liquid feeding system has above novel apparatus of the first present invention.

It is also preferable that the reservoir has a mixing adjuster for adjusting a ratio of a polishing particle containing liquid to a hydrogen peroxide solution.

The second present invention provides a method of supplying a polishing liquid including polishing particles and hydrogen peroxide for carrying out a chemical mechanical polishing method to a surface of a wafer to be polished, wherein the polishing liquid is subjected to an irradiation of an ultraviolet ray for subsequent application of the same onto a polishing surface of the wafer.

It is also preferable that the ultraviolet ray has a wavelength in the range of 150–320 nanometers.

It is also preferable that the polishing liquid has a mixing ratio of a polishing particle containing liquid to a hydrogen peroxide solution in the range of 1:1 to 10:1.

It is also preferable that the polishing liquid subjected to the irradiation of the ultraviolet ray is applied onto the polishing surface of the wafer without exposing the polishing liquid to an atmosphere.

It is also preferable that the polishing liquid subjected to the irradiation of the ultraviolet ray is applied onto the polishing surface of the wafer within one minute.

Figure 2:
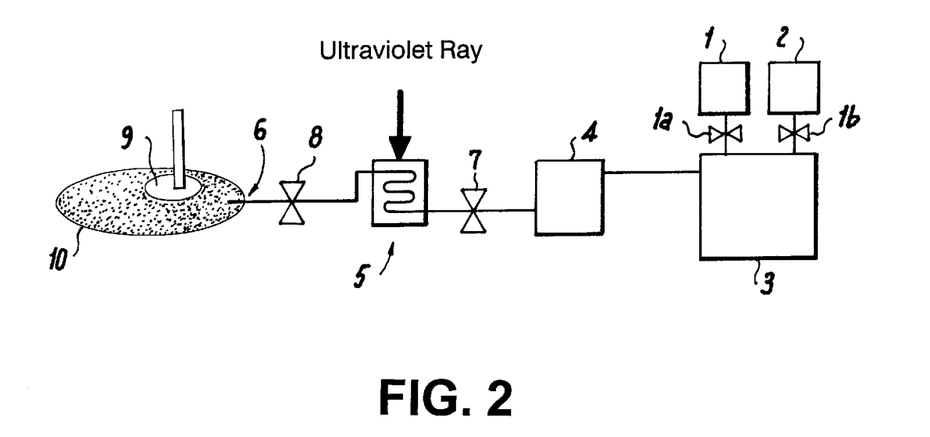
FIG. 2 which is a schematic view illustrative of a novel slurry supply system for a chemical mechanical polishing for polishing a tungsten layer on a surface of the semiconductor wafer on the polishing pad in accordance with the present invention.

Detailed descriptions of the present invention will be described with reference to FIG. 2 which is a schematic view illustrative of a slurry supply system for a chemical mechanical polishing for polishing a tungsten layer on a surface of the semiconductor wafer on the polishing pad. A polishing liquid tank 1 is provided which contains a polishing liquid including silica particles as polishing particles. A hydrogen peroxide solution tank 2 is provided which contains a hydrogen peroxide solution. A polishing liquid tank 3 is also provided which is connected through a first valve 1a to the polishing liquid tank 1 and also connected through a second valve 1b to the hydrogen peroxide solution tank 2. The polishing liquid including silica particles is fed through the first valve 1a to the polishing liquid tank 3. The hydrogen peroxide solution is also fed through the second valve 1b to the polishing liquid tank 3. The first valve 1a controls a flow rate of the polishing liquid including silica particles whilst the second valve controls a flow rate of the hydrogen peroxide solution tank 2. A ratio of the polishing liquid to the hydrogen peroxide solution is controllable by controlling the respective opening degrees of the first and second values The hydrogen peroxide solution and the polishing liquid are then mixed in the polishing liquid tank 3 to form the polishing liquid to be stored in the polishing liquid tank 3. A polishing liquid feeding system is also provided which is connected to the polishing liquid tank 3 for feeding the polishing liquid onto a polishing pad on which the semiconductor wafer is polished. The polishing liquid feeding system has a feeding pipe for allowing the polishing liquid to be fed through the feeding pipe. The polishing liquid feeding system has a feeding pump 4 for feeding the polishing liquid through the feeding pipe. The polishing liquid feeding system has a polishing liquid activation system 5. A first valve 7 is provided on the feeding pipe in an upstream side of the polishing liquid activation system 5 for controlling the flow rate of the polishing liquid to be entered into the polishing liquid activation system 5. A second valve 8 is also provided on the feeding pipe in a downstream side of the polishing liquid activation system 5 for controlling the flow rate of the polishing liquid already activated by the polishing liquid activation system 5 and to be fed onto the polishing pad 10. It is preferable that a downstream side tube of the feeding pipe from the polishing liquid activation system 5 has a length of not longer than 5 meters for preventing deterioration of the polishing liquid activated by the polishing liquid activation system 5. It is more preferable that the length of the downstream tube of the feed pipe is not longer than 1 meter for preventing the reservation of the polishing liquid in the downstream side tube of the feeding pipe. The necessary concentration of the hydrogen peroxide solution for allowing the polishing liquid to be activated by irradiation of the ultraviolet ray is not less than 0.1%. The activation of the hydrogen peroxide solution generates OH-radicals.

A mixture ratio of the silica particle containing polishing liquid to a hydrogen peroxide solution of 30% concentration may be in the range of 1:1 to 10:1 so that the ratio of the polishing liquid to the hydrogen peroxide solution for rising the polishing rate. Alternatively, it is also possible that the mixture solution is diluted with a pure water by two to ten times for controlling the polishing rate. In place of the silica particles, alumina particles or cerium oxide particles are also available as polishing particles.

Figure 3A:
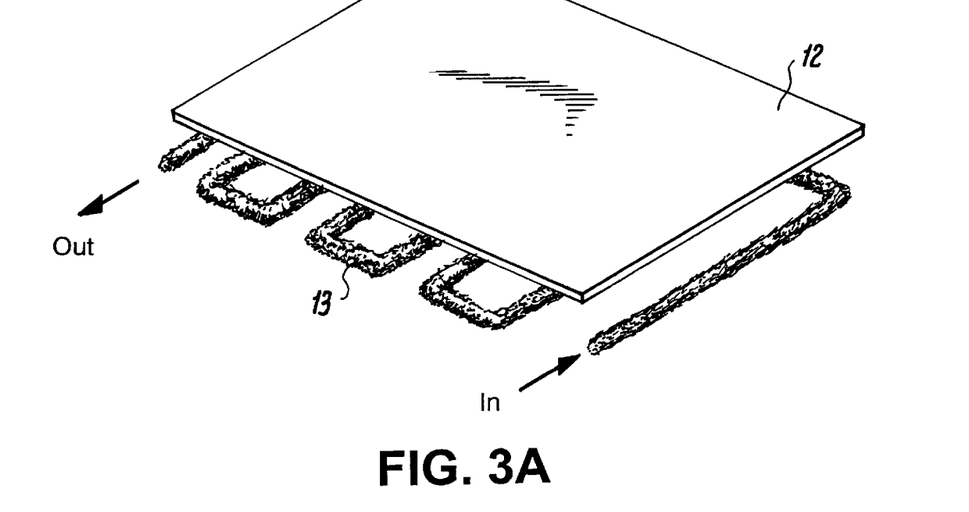
FIG. 3A is a schematic perspective view illustrative of a polishing liquid activation system of a polishing liquid feeding system in a chemical mechanical polishing system in accordance with the present invention.
Figure 3B:
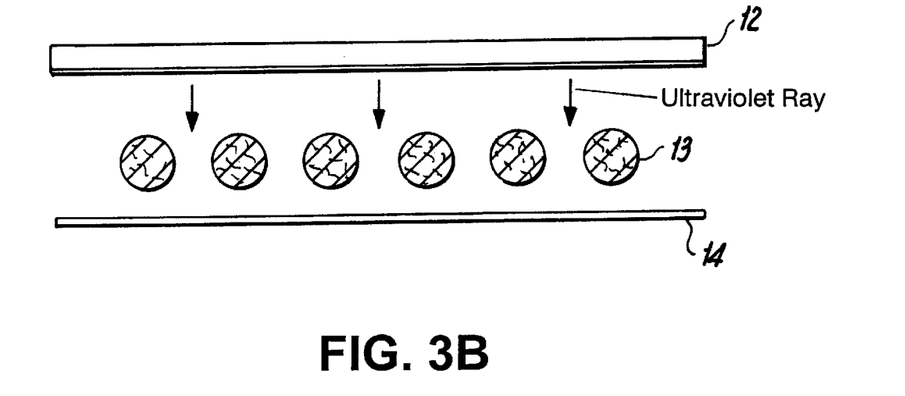
FIG. 3B is a cross sectional view illustrative of a polishing liquid activation system of a polishing liquid feeding system in a chemical mechanical polishing system in accordance with the present invention

FIG. 3A is a schematic perspective view illustrative of a polishing liquid activation system of a polishing liquid feeding system in a chemical mechanical polishing system. FIG. 3B is a cross sectional view illustrative of a polishing liquid activation system of a polishing liquid feeding system in a chemical mechanical polishing system. The polishing liquid activation system 5 has a quartz glass tube 13 for allowing the polishing liquid to be flown through the quartz glass tube 13. The polishing liquid activation system 5 also has a mercury lamp 12 positioned over the quartz glass tube 13 for irradiating an ultraviolet ray through the quartz glass tube 13 onto the polishing liquid, whereby the polishing liquid is activated by the ultraviolet ray to form OH-radicals. The polishing liquid activation system 5 also has a mirror 14 in an opposite side to the mercury lamp 12 with reference to the quartz glass tube 13 so that the quartz glass tube 13 extends through an inter-space defined between the mercury lamp 12 and the mirror 14. The mirror 14 reflects the ultraviolet ray to the quartz glass tube 13 for re-irradiation of an ultraviolet ray through the quartz glass tube 13 onto the polishing liquid, whereby the mirror improves the efficiency in irradiation of the ultraviolet ray onto the polishing liquid. The quartz glass tube 13 is of course transparent to the ultraviolet ray. The quartz glass tube 13 extends in zigzag or snake form so that the quartz glass tube 13 extends throughout the inter-space between the mercury lamp 12 and the mirror 14.

Figure 5:
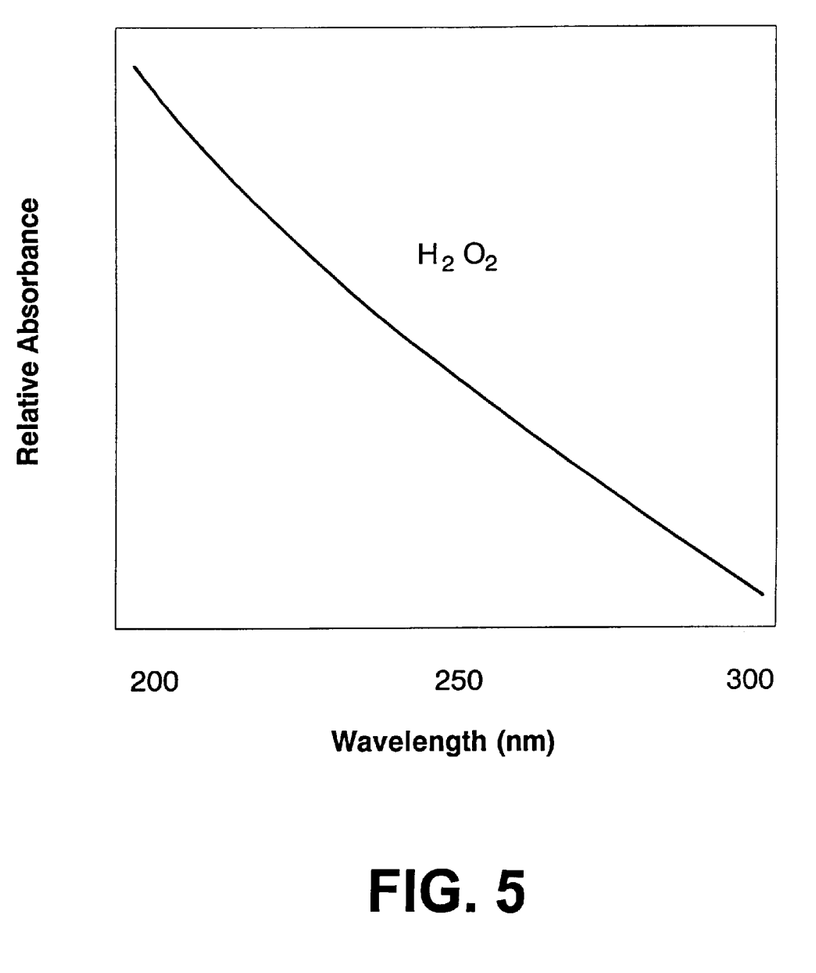
FIG. 5 is a diagram illustrative of a variation in relative absorbance of hydrogen peroxide to an ultraviolet ray having various wavelengths over wavelength of the absorbable ultraviolet ray.

FIG. 5 is a diagram illustrative of a variation in relative absorbance of hydrogen peroxide to an ultraviolet ray having various wavelengths over wavelength of the absorbable ultraviolet ray. An absorption wavelength band of the hydrogen peroxide solution is a low wavelength band of not higher than 300 nanometers, for which reason an available wavelength range of the ultraviolet ray is 150–320 nanometers. As the ultraviolet ray irradiation lamp, a high pressure mercury lamp, a low pressure mercury lamp, a xenon lamp having an emission peak at about 250 nanometers are also available. A large capacitive low pressure mercury lamp is preferable which has a large irradiation of 200 W/cm$^2$. The flow rate of the polishing liquid through the quartz glass tube 13 is controlled by the third and fourth valves 7 and 8 so that the time duration for irradiation of the ultraviolet ray onto the polishing liquid is adjusted. This adjustment in the tine duration for irradiation of the ultraviolet ray onto the polishing liquid results in adjustment in an amount of the generated OH-radicals in the polishing liquid, wherein the OH-radicals are generated by the irradiation of the ultraviolet ray onto the polishing liquid.

In accordance with the present invention, only hydrogen peroxide is used as the oxidizing agent without using iron nitrate. Irradiation of the ultraviolet say to hydrogen peroxide in the polishing liquid generates the OH-radicals which increase the oxidizing power of the polishing liquid. After the activation of the polishing liquid by irradiation of the ultraviolet ray to hydrogen peroxide in the polishing liquid, the activated polishing liquid is supplied onto the polishing pad within a possible short time for suppressing or preventing a deterioration in oxidizing power of the activated polishing liquid. The polishing liquid activated by the ultraviolet ray irradiation is initiated to become deteriorated after five minutes from the activation of the polishing liquid, for which reason it is preferable to feed the activated polishing liquid onto the polishing pad within one minute without exposing the same to an atmosphere. It is also preferable that the length of the downstream side tube of the feeding pipe is not longer than 5 meters.

As described above, the absorption wavelength band of the hydrogen peroxide solution is the ultraviolet ray wavelength band, for which reason the irradiation of the ultraviolet ray onto the hydrogen peroxide in the polishing liquid generates a large amount of OH-radicals which have a large oxidizing power which is similar oxidizing power to the conventional polishing liquid containing the iron nitrate.

The above chemical maniacal polishing is applied to polish a tungsten layer in a surface of the semiconductor wafer. Notwithstanding, the above novel chemical maniacal polishing is applied to polish a copper or aluminum layer in a surface of the semiconductor wafer.

An example of the above present invention will be described. A polishing solution having 20% by weight of silica particles which have an averaged diameter in the range of 0.05 micrometers to 0.2 micrometers is stored in the polishing solution tank 1. A hydrogen peroxide solution is stored in the hydrogen peroxide solution tank 2. The polishing solution is fed at a flow rate of 120 cc/min to the polishing liquid tank 3 and the hydrogen peroxide solution is fed at a flow rate of 30 cc/min to the polishing liquid tank 3. The polishing solution and the hydrogen peroxide solution are mixed in the polishing liquid tank 3 thereby to form the polishing liquid. The polishing liquid is fed through the feeding pipe having the polishing liquid activation system 5 onto the polishing pad 10 at a flow rate of about 50 cc/min. The flow rate of the polishing liquid is controlled by the third and fourth valves 7 and 8. The quartz glass tube 13 has a diameter of 4 millimeters for allowing the polishing liquid to be flown through the same. The mercury lamp 12 has a square-plate shape of 10 centimeters. The mercury lamp 12 is distanced from the quartz glass tube 13 by 1 centimeter for irradiating an ultraviolet ray having a wavelength of 248 nanometers through the quartz glass tube 13 onto the polishing liquid, whereby the polishing liquid is activated by the ultraviolet ray to form OH-radicals. The mirror 14 is provided in an opposite side to the mercury lamp 12 with reference to the quartz glass tube 13 so that the quartz glass tube 13 extends through an inter-space defined between the mercury lamp 12 and the mirror 14. The mirror 14 reflects the ultraviolet ray to the quartz glass tube 13 for re-irradiation of the reflected ultraviolet ray through the quartz glass tube 13 onto the polishing liquid, whereby the mirror improves the efficiency in irradiation of the ultraviolet ray onto the polishing liquid. The quartz glass tube 13 is of course transparent to the ultraviolet ray. The quartz glass tube 13 extends in zigzag or snake form so that the quartz glass tube 13 extends throughout the inter-space between the mercury lamp 12 and the mirror 14. A downstream side tube 6 of the feeding pipe is defined between the polishing liquid activation system 5 and a polishing liquid supply port through which the polishing liquid is supplied onto the polishing pad 10. The downstream side tube 6 has a length of about 1 meter. The downstream side tube 6 may comprise a polyvinyl alcohol tube. The polishing liquid is free of any metal such as iron nitrate, for which reason no metal such as Fe remains on the polished surface of the wafer after the chemical mechanical polishing is carried out. Since the irradiation of the ultraviolet ray onto the polishing liquid containing hydrogen peroxide generates OH-radicals which provides a large oxidizing power which is substantially the same as the conventional polishing liquid containing iron nitride the polishing rate of the novel chemical mechanical polishing by use of the metal free polishing liquid is substantially the same as the polishing rate of the conventional polishing liquid containing iron nitride even the novel chemical mechanical polishing by use of the metal free polishing liquid is free from the problem with heavy metal contamination to the polished surface of the semiconductor wafer.

Figure 6:
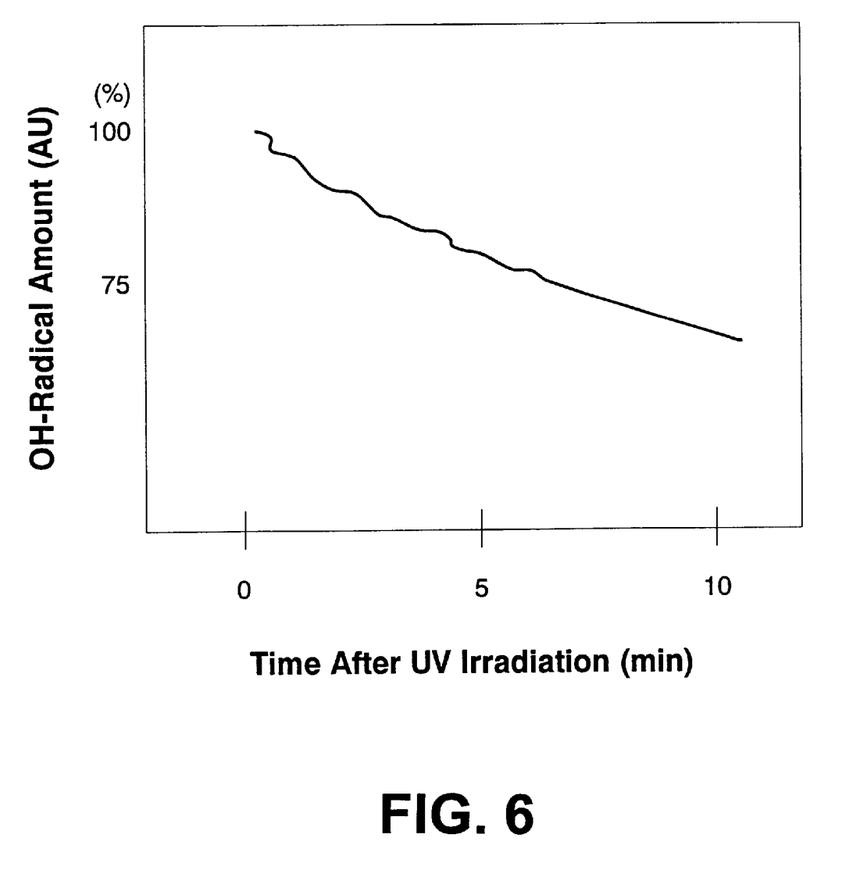
FIG. 6 is a diagram illustrative of a variation in measured amount of OH-radicals generated by the activation of the polishing liquid by the ultraviolet ray irradiation over time after the ultraviolet ray irradiation.

In order to evaluate the influence of exposure of the activated polishing liquid to the atmosphere, the metal free polishing liquid of the present invention is activated and then exposed to an atmosphere so as to measure variation in amount of OH-radicals generated by the activation of the polishing liquid by the ultraviolet ray irradiation over time. FIG. 6 is a diagram illustrative of a variation in measured amount of OH-radicals generated by the activation of the polishing liquid by the ultraviolet ray irradiation over time after the ultraviolet ray irradiation. The amount of the OH-radicals generated in the polishing liquid by the ultraviolet ray irradiation is simply decreased as time passes from the ultraviolet ray irradiation.

Figure 7:
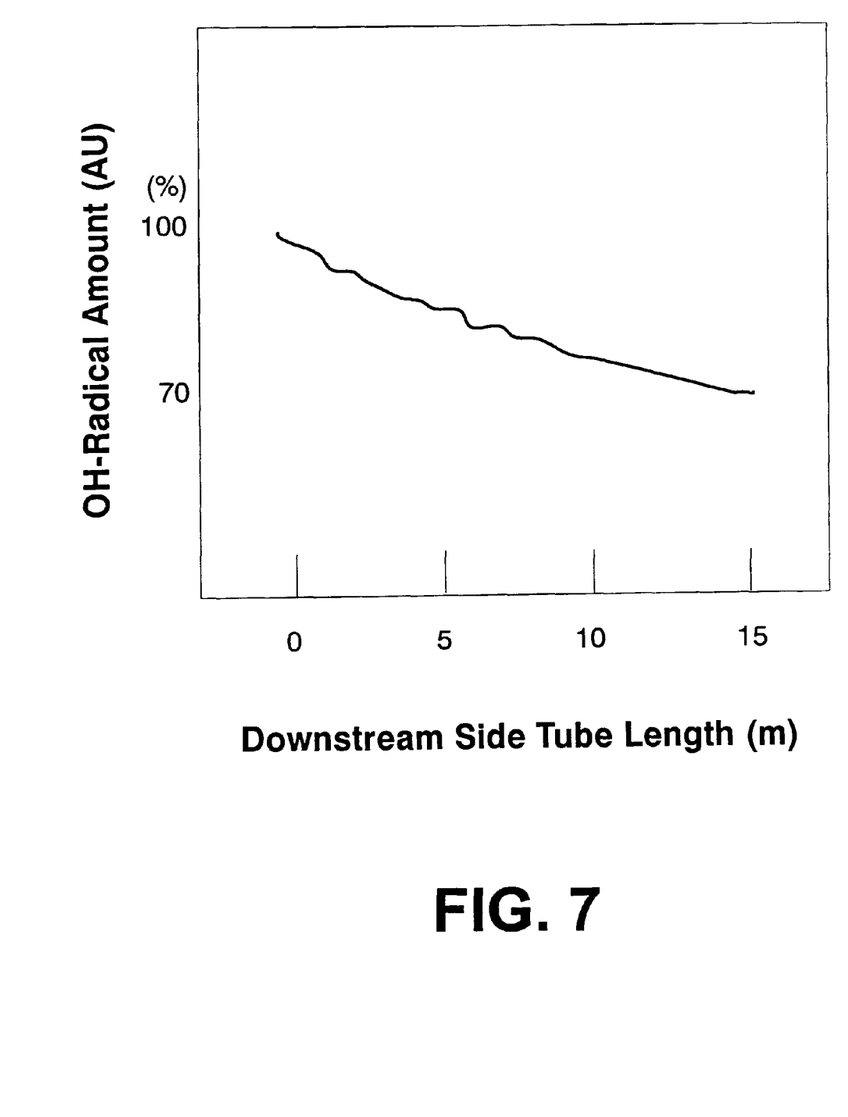
FIG. 7 is a diagram illustrative of a variation in amount of OH-radicals generated by passing the polishing liquid through the downstream feeding tube having various lengths over the length of the downstream feeding tube.

In order to also evaluate the influence to the amount of OH-radicals by the length of the downstream feeding tube 6 from the polishing liquid activation system 5, the metal free polishing liquid of the present invention is activated and then fed through the so as to measure variation in amount of OH-radicals generated by passing the polishing liquid through the downstream feeding tube 6 having various lengths over the length of the downstream feeding tube 6. FIG. 7 is a diagram illustrative of a variation in amount of OH-radicals generated by passing the polishing liquid through the downstream feeding tube having various lengths over the length of the downstream feeding tube. The amount of the OH-radicals generated in the polishing liquid by the ultraviolet ray irradiation is simply decreased as the length of the downstream feeding tube becomes longer.

Figure 4:
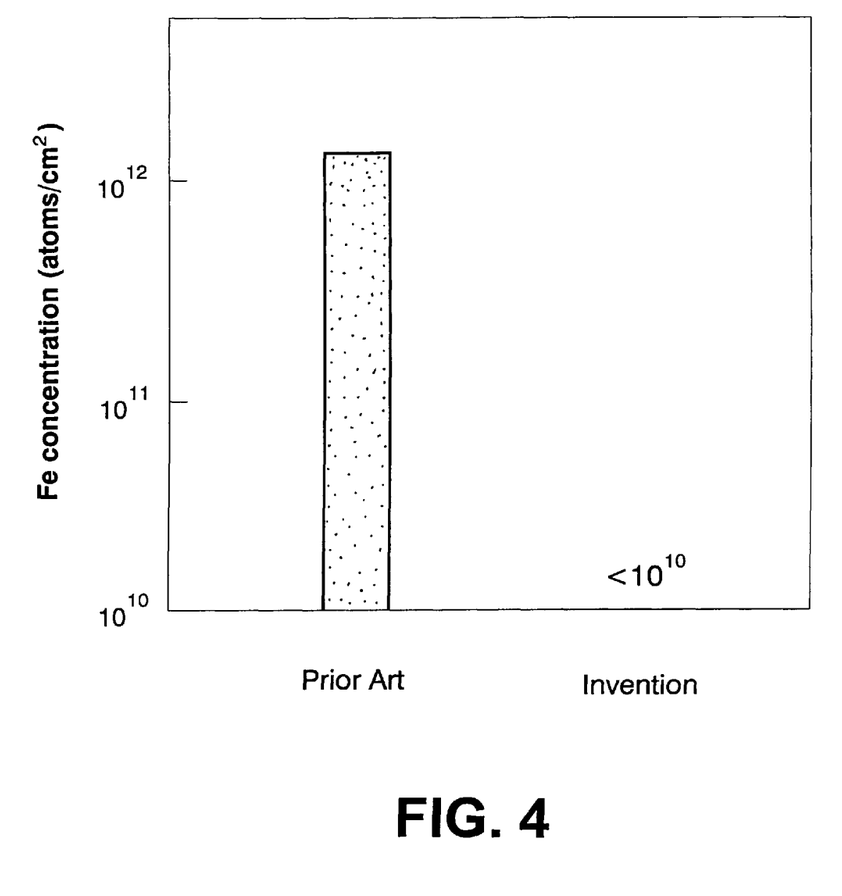
FIG. 4 is a diagram illustrative of concentrations of residual Fe as contaminating the polished surface of the wafer both when the conventional chemical mechanical polishing method is carried out by using a conventional iron nitrate containing polishing liquid and when the novel chemical mechanical polishing method is carried out by using a novel iron nitrate free polishing liquid activated by the ultraviolet ray irradiation.

FIG. 4 is a diagram illustrative of concentrations of residual Fe as contaminating the polished surface of the wafer both when the conventional chemical mechanical polishing method is carried out by using a conventional iron nitrate containing polishing liquid and when the novel chemical mechanical polishing method is carried out by using a novel iron nitrate free polishing liquid activated by the ultraviolet ray irradiation. After the conventional chemical mechanical polishing method was carried out, then the measured concentration of the residual Fe on the polished surface of the wafer is about $1 \times 10^{12}$ atoms/cm$^2$. This high concentration level of the residual Fe on the polished surface of the wafer requires a cleaning process for removing the contaminating residual Fe from the polished surface of the wafer without, however, etching, the metal layer such as tungsten, tungsten nitride or titanium layer shown on the polished surface of the wafer. By contrast, after the novel chemical mechanical polishing method was carried out, then the measured concentration of the residual Fe on the polished surface of the wafer is about less than $1 \times 10^{10}$ atoms/cm$^2$. This low concentration level of the residual Fe on the polished surface of the wafer requires no cleaning process for removing the contaminating residual Fe from the polished surface of the wafer.

As a modification to the above present invention of the chemical mechanical polishing method to the tungsten layer on the polishing surface of the wafer, the above novel chemical mechanical polishing method using the polishing liquid activated by the ultraviolet ray irradiation is applicable to other metal layers such as Al, Cu, TiN, Ti, Ta, TiW, WN, TaN, and TaSiN. Those metals are oxidized by the polishing liquid and also the oxidation is promoted by the OH-radicals generated by the ultraviolet ray irradiation.

As a further modification to the above present invention, in place of the silica particles as the polishing particles, alumina particles are also available.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An apparatus for activating a polishing liquid including polishing particles and hydrogen peroxide for carrying out a chemical mechanical polishing method to a surface of a wafer to be polished, comprising a tube transparent to an ultraviolet ray for allowing said polishing liquid to be flowed through said tube and for isolating said polishing liquid from an atmosphere; and an ultraviolet ray irradiator provided outside of said tube for irradiating an ultraviolet ray through said tube onto said polishing liquid.

2. The apparatus as claimed in claim 1, wherein said ultraviolet ray irradiator is capable of emitting said ultraviolet ray in the range of 150–320 nanometers.

3. The apparatus as claimed in claim 1, wherein said ultraviolet ray irradiator comprises one of a high pressure mercury lamp, a low pressure mercury lamp and a xenon lamp.

4. The apparatus as claimed in claim 1, wherein said tube has a flow rate adjuster for adjusting a flow rate of said polishing liquid for controlling a time of irradiation of said ultraviolet ray onto said polishing liquid.

5. The apparatus as claimed in claim 1, wherein said tube comprises a quartz glass tube.

6. The apparatus as claimed in claim 1, wherein said tube has a length of not longer than 5 meters for preventing any reservation of said polishing liquid.

7. The apparatus as claimed in claim 6, wherein said tube has a length of not longer than 1 meter for preventing any reservation of said polishing liquid.

8. The apparatus as claimed in claim 1, further comprising an ultraviolet ray mirror provided in an opposite side to said ultraviolet ray irradiator with reference to said tube so that said tube extends between said ultraviolet ray irradiator and said ultraviolet ray mirror.

9. The apparatus as claimed in claim 8, wherein said ultraviolet ray irradiator and said ultraviolet ray mirror two-dimensionally extend to form an inter-space defined between said ultraviolet ray irradiator and said ultraviolet ray mirror, whilst said tube extends with curving through out entirely said inter-space.

10. A chemical mechanical polishing system comprising:
   a reservoir for reserving a polishing liquid including polishing particles and hydrogen peroxide;
   a polishing pad for carrying out a chemical mechanical polishing to a wafer;
   a polishing liquid feeding system connected to said reservoir for feeding said polishing liquid onto said polishing pad;
   a tube transparent to an ultraviolet ray for allowing said polishing liquid to be flowed through said tube and for isolating said polishing liquid from an atmosphere; and
   an ultraviolet ray irradiator provided outside of said tube for irradiating an ultraviolet ray through said tube onto said polishing liquid.

11. The chemical mechanical polishing system as claimed in claim 10, wherein said reservoir has a mixing adjuster for adjusting a ratio of a polishing particle containing liquid to a hydrogen peroxide solution.

12. A method of supplying a polishing liquid including polishing particles and hydrogen peroxide for carrying out a chemical mechanical polishing method to a surface of a wafer to be polished comprising,
   subjecting said polishing liquid to an irradiation by an ultraviolet ray and applying said polishing liquid onto a polishing surface of said wafer.

13. The method as claimed in claim 12, wherein said ultraviolet ray has a wavelength in the range of 150–320 nanometers.

14. The method as claimed in claim 12, wherein said polishing liquid has a mixing ratio of a polishing particle containing liquid to a hydrogen peroxide solution in the range of 1:1 to 10:1.

15. The method as claimed in claim 12, wherein said polishing liquid subjected to said irradiation of said ultraviolet ray is applied onto said polishing surface of said wafer without exposing said polishing liquid to an atmosphere.

16. The method as claimed in claim 15, wherein said polishing liquid subjected to said irradiation of said ultraviolet ray is applied onto said polishing surface of said wafer within one minute.

* * * * *